United States Patent
Sin et al.

(10) Patent No.: US 6,803,615 B1
(45) Date of Patent: Oct. 12, 2004

(54) MAGNETIC TUNNEL JUNCTION MRAM WITH IMPROVED STABILITY

(75) Inventors: Kyusik Sin, Pleasanton, CA (US); Xizeng Shi, Fremont, CA (US); Hugh Craig Hiner, Fremont, CA (US)

(73) Assignee: Western Digital (Fremont), Inc., Fremont, CA (US)

( * ) Notice: Subject to any disclaimer, the term of this patent is extended or adjusted under 35 U.S.C. 154(b) by 196 days.

(21) Appl. No.: 10/020,663

(22) Filed: Dec. 14, 2001

Related U.S. Application Data

(60) Provisional application No. 60/271,321, filed on Feb. 23, 2001.

(51) Int. Cl.[7] .............................................. H01L 29/76
(52) U.S. Cl. ............................ 257/295; 257/296; 438/3
(58) Field of Search ................................ 257/295, 296; 438/3

(56) References Cited

U.S. PATENT DOCUMENTS

| | | | |
|---|---|---|---|
| 5,940,319 A | | 8/1999 | Durlam et al. |
| 5,986,858 A | * | 11/1999 | Sato et al. ................ 360/324.2 |
| 6,028,786 A | * | 2/2000 | Nishimura .................. 365/173 |
| 6,174,737 B1 | | 1/2001 | Durlam et al. |
| 6,185,143 B1 | | 2/2001 | Perner et al. |
| 6,205,052 B1 | * | 3/2001 | Slaughter et al. ........... 365/173 |
| 6,317,376 B1 | | 11/2001 | Tran et al. |
| 6,510,078 B2 | * | 1/2003 | Schwarzl ..................... 365/158 |

* cited by examiner

*Primary Examiner*—Richard Elms
*Assistant Examiner*—Christian D. Wilson
(74) *Attorney, Agent, or Firm*—Carr & Ferrell LLP

(57) ABSTRACT

An MRAM cell includes a pinned layer, a free layer, and a bit line with a magnetic sheath. The magnetic sheath allows a magnetic field to circulate in a loop around the bit line. The looping magnetic field can couple with the magnetic field of the free layer for enhanced stability with respect to stray magnetic fields and elevated temperatures.

47 Claims, 10 Drawing Sheets

MAGNETIC TUNNEL JUNCTION MRAM WITH IMPROVED STABILITY

RELATED APPLICATIONS

This application claims the benefit of U.S. Provisional Application No. 60/271,321, filed Feb. 23, 2001, incorporated herein in its entirety.

BACKGROUND

1. Field of the Invention

The present invention relates generally to data storage and more particularly to an improved structure for a conductive line connected to a Magnetic Tunnel Junction (MTJ) of a Magnetic Random Access Memory (MRAM) cell.

2. Description of the Prior Art

A wide range of presently available media for data storage vary in several attributes including access speed, duration of reliable storage, and cost. Static Random Access Memory (SRAM) is the storage medium with the best access speed for the cost in applications such as cache memories. However, SRAM is volatile, meaning that it only maintains storage while power is continuously applied. Accordingly, computer users endure lengthy waits when they power-up their computers while substantial amounts of data are written from non-volatile but slow media, such as magnetic disks, into much faster random access memory (e.g., SRAM).

Flash memory is a solid-state storage medium that provides moderate access times and that is non-volatile. Flash memory has the disadvantage that it has a limited lifetime, on the order of one million cycles per cell, after which a cell can no longer be written to. This lifetime is orders of magnitude too short for a random access memory in most modern computing system.

Another solid-state storage medium is Magnetic Random Access Memory (MRAM), which employs a Magnetic Tunnel Junction (MTJ) formed of layers of magnetic material and an insulating barrier. FIG. 1 shows a cross-section of a prior art MRAM cell 10 including an MTJ 12 formed of a pinned layer 14 and a free layer 16, which are magnetic layers typically formed of ferromagnetic materials, and a thin dielectric layer 18 disposed between layers 14 and 16. Pinned layer 14 has a magnetic moment orientation 20 that is fixed from rotating, while free layer 16 has a magnetic moment orientation 22 that is free to rotate in response to applied magnetic fields. Methods of pinning a pinned layer 14 are well known in the art and include the use of an adjacent antiferromagnetic layer 24.

In an MRAM unit 10, a bit of data is encoded in the direction of the magnetic moment orientation 22 of the free layer 16 relative to the magnetic moment orientation 20 of the pinned layer 14. As is well known in the art, when the two magnetic moment orientations 20 and 22 are parallel the resistance measured across the MTJ 12 is relatively low, and when the two magnetic moment orientations 20 and 22 are antiparallel the resistance measured across the MTJ 12 is relatively high. Accordingly, one can determine whether the magnetic moment orientations 20 and 22 are parallel or antiparallel by reading the resistance across the MTJ 12 with a read current. Typical read currents are on the order of 1–50 μA.

In an MRAM unit 10, the state of the bit, parallel or antiparallel, is varied by applying a write current $I_W$, typically on the order of 1–25 mA, through two conductors, a bit line 28 and a digit line 26, situated proximate to the MTJ 12. The bit line 28 and the digit line 26 cross one another at approximately right angles above and below the MTJ 12. As is well known in the art, although the pinned layer 14 is depicted in FIG. 1 as nearer to the bit line 26, an MRAM cell 10 also functions with the pinned layer 14 nearer to the digit line 28.

As is well known, a magnetic field develops around an electric current in a wire. Accordingly, two magnetic fields arise when write currents $I_W$ are simultaneously applied to both the bit line 28 and the digit line 26. The two magnetic fields combine at the free layer 16 to influence the magnetic moment orientation 22. The magnetic moment orientation 22 of the free layer 16 is changed between the parallel and antiparallel states by changing the direction of the write current $1_W$ in either the bit line 28 or the digit line 26. Changing (by a write control circuit, not shown) the direction of the write current $I_W$ in one of the lines 26 or 28 reverses the direction of the magnetic field around that conductor and thereby reverses the direction of the combined magnetic field at the free layer 16.

In an MRAM unit 10, the state of the bit is read by passing a read current $I_R$ through the MTJ 12. The bit line 28 is used to conduct the read current $I_R$ to the MTJ 12. In some embodiments a transistor (not shown) is used to allow the read current $I_R$ to flow from the bit line 28 through the MTJ 12 and out through a bottom lead 25 during a read operation while preventing the write current $I_W$ from flowing through the MTJ 12 during a write operation. An insulating spacer 27 is disposed between the bottom lead 25 and the digit line 26 to prevent shorting between the two.

FIG. 2 shows a cross-section of an array 30 of MRAM cells 10 of the prior art. A line 1—1 shows the orientation of the cross-section shown previously in FIG. 1. FIG. 2 illustrates three MRAM cells 10 connected to one bit line 28. An array 30 can include any number of MRAM cells 10 on a single bit line 28. Similarly, there can also be any number of MRAM cells 10 associated with each digit line 26 arranged in a line extending perpendicularly to the plane of the drawing. Accordingly, an array 30 typically consists of a lattice of digit lines 26 and bit lines 28, with an MRAM cell 10 at each point of intersection between the bit lines 28 and the digit lines 26. In order to affect a particular MRAM cell 10, control circuitry (not shown) is used to select the appropriate bit line 28 and digit line 26. For a write operation to the selected MRAM cell 10, the control circuitry directs a write current through each of the appropriate bit and digit lines 28 and 26. A transistor 32, which may be a CMOS transistor, is connected by a conductive line 34 to the MTJ 12 to selectively isolate the MTJ 12 from the remainder of the circuitry. During a write operation, the transistor 32 is open to prevent the write current $I_W$ in the bit line 28 from flowing through the MTJ 12. During a read operation, however, the state of the transistor 32 is switched to closed so that the read current can flow through the MTJ 12.

Referring again to FIG. 1, the magnetic moment orientation 22 of the free layer 16 is represented as a single vector with a unique direction. While the direction of the magnetic moment within the free layer 16 generally has the orientation 22, near the edges of the free layer 16 the magnetic spins tend to curl away from the orientation 22 due to a demagnetization field. As noted above, when the two magnetic moment orientations 20 and 22 are parallel the resistance measured across the MTJ 12 is relatively low, and when the two magnetic moment orientations 20 and 22 are antiparallel the resistance measured across the MTJ 12 is relatively high. However, the curling effect tends to decrease the relatively high resistance and to increase the relatively low resistance such that the difference between the two states is reduced. Further, the curling effect is a dynamic effect and varies over time, causing the resistance across the MTJ 12 to continually vary in either the high or low resistance states. Thus, the reproducibility of the signal amplitude, the voltage measured across the MTJ 12, is reduced by the curling effect. The curling effect and its influence on reproducibility are also exacerbated by high temperatures and stray magnetic fields, making the MRAM cell 10 less stable and more likely to switch states unintentionally.

U.S. Pat. No. 6,174,737 B1 issued to Durlam et al., discloses an MRAM having a bit line, a magnetic memory element, and an electrically conductive layer disposed between the bit line and the magnetic memory element. Durlam et al. also discloses a Permalloy field focusing layer used in conjunction with both bit and digit lines. Durlam et al. does not explain specifically how a field focusing layer functions, except to say that a field focusing layer "facilitates magnetic fields to concentrate on the magnetic memory element." It is surmised that the term "field focusing" is meant to imply that the layer serves to bend, reflect, or otherwise focus the magnetic field generated by the bit line or digit line in the direction of the magnetic memory element. Accordingly, Durlam et al. does not interpose a Permalloy layer between the digit or bit lines and the magnetic memory element because such a layer would tend to block the focusing effect and deflect the magnetic field away from the magnetic memory element.

Accordingly, what is desired is an improved design for an MRAM cell that reduces the curling effect within the free layer for increased stability.

SUMMARY

An MRAM cell includes a magnetic tunneling junction, a bit line, and a digit line. The magnetic tunneling junction includes a free layer, a pinned layer, and a spacer layer disposed between them. The digit line includes a segment that is proximate to the pinned layer. The bit line includes a segment in electrical contact with the free layer. The MRAM cell also includes a magnetic liner layer disposed around the bit line segment and contacting the free layer. In some embodiments the magnetic liner layer together with the free layer form a sheath around the bit line segment. Because the sheath is a closed circuit formed of a magnetic material, a magnetic loop can encircle the bit line segment. The magnetic loop takes on the same orientation as the magnetic moment orientation of the free layer and eliminates the curling effect. In other embodiments the magnetic liner layer forms the entire sheath around the bit line segment. In these embodiments the liner layer contacts and is magnetically coupled to the free layer so that the magnetic loop takes on the same orientation as the magnetic moment orientation of the free layer. In additional embodiments the magnetic liner layer is electrically conductive so that it may carry a portion of the write current or the read current through the bit line segment.

Providing a magnetic loop around the digit line at the location of the magnetic tunnel junction creates several advantages. A first advantage is increased stability at elevated temperatures and in the presence of stray magnetic fields due to a reduction in the curling effect within the free layer. A second advantage is a reduction in power consumption. Power consumption is cut by the invention because the magnetic field from the digit line is concentrated at the free layer by the liner layer, thus reducing the amount of current necessary to produce a sufficient field at the free layer.

A method of fabricating an MRAM cell includes forming a digit line on a substrate and forming an insulating spacer including a contact via over the digit line. The digit line may be formed by patterning an oxide layer, filling the patterned lines with a conductive metal, and planarizing the top surface. The method of fabricating an MRAM cell further includes forming a bottom lead over the insulating spacer, which also may be achieved by patterning. The contact via in the insulating spacer allows the bottom lead to be electrically connected to an underlying CMOS transistor.

The method of fabricating an MRAM cell further includes forming a magnetic tunnel junction stack over the bottom lead. Forming the magnetic tunnel junction stack can include forming a first ferromagnetic layer over the bottom lead, forming a tunneling barrier layer over the first ferromagnetic layer, and forming a second ferromagnetic layer over the tunneling barrier layer. Forming the magnetic tunnel junction stack can also include forming an antiferromagnetic layer above the second ferromagnetic layer or forming the antiferromagnetic layer between the first ferromagnetic layer and the bottom lead. When the magnetic liner layer forms the entire sheath around the bit line segment, the antiferromagnetic layer should be formed between the first ferromagnetic layer and the bottom lead.

The method of fabricating an MRAM cell may also include forming an insulating material layer around the magnetic tunnel junction stack, and forming a silicon dioxide layer over the insulating material layer and over the magnetic tunnel junction stack. A trench with sidewalls can be formed in the silicon dioxide layer over the magnetic tunnel junction stack.

The method of fabricating an MRAM cell additionally includes forming a first liner layer over the magnetic tunnel junction, forming a bit line over the magnetic tunnel junction stack, and forming a second liner layer over the bit line. In some embodiments the liner layer is only formed on the sidewalls of the trench in order to produce a device in which three sides of a sheath around a bit line segment is formed by the magnetic liner layer and a fourth side of the sheath is formed by the free layer of the magnetic tunnel junction stack. In other embodiments the liner layer is also formed on the bottom of the trench and above the free layer to produce a device in which the sheath around the digit line segment is formed entirely by the magnetic liner layer. Forming the digit line can include plating a conductive metal over a seed layer to completely fill the trench, followed by a planarization. Forming a second liner layer over the digit line can also include forming and patterning a mask to allow the selective removal of the layer except over the bit line segment where it completes the sheath.

BRIEF DESCRIPTION OF DRAWINGS

The present invention is illustrated by way of example, and not by way of limitation, in the figures of the accompanying drawings and in which like reference numerals refer to similar elements and in which.

DETAILED DESCRIPTION OF THE INVENTION

Figure 1:
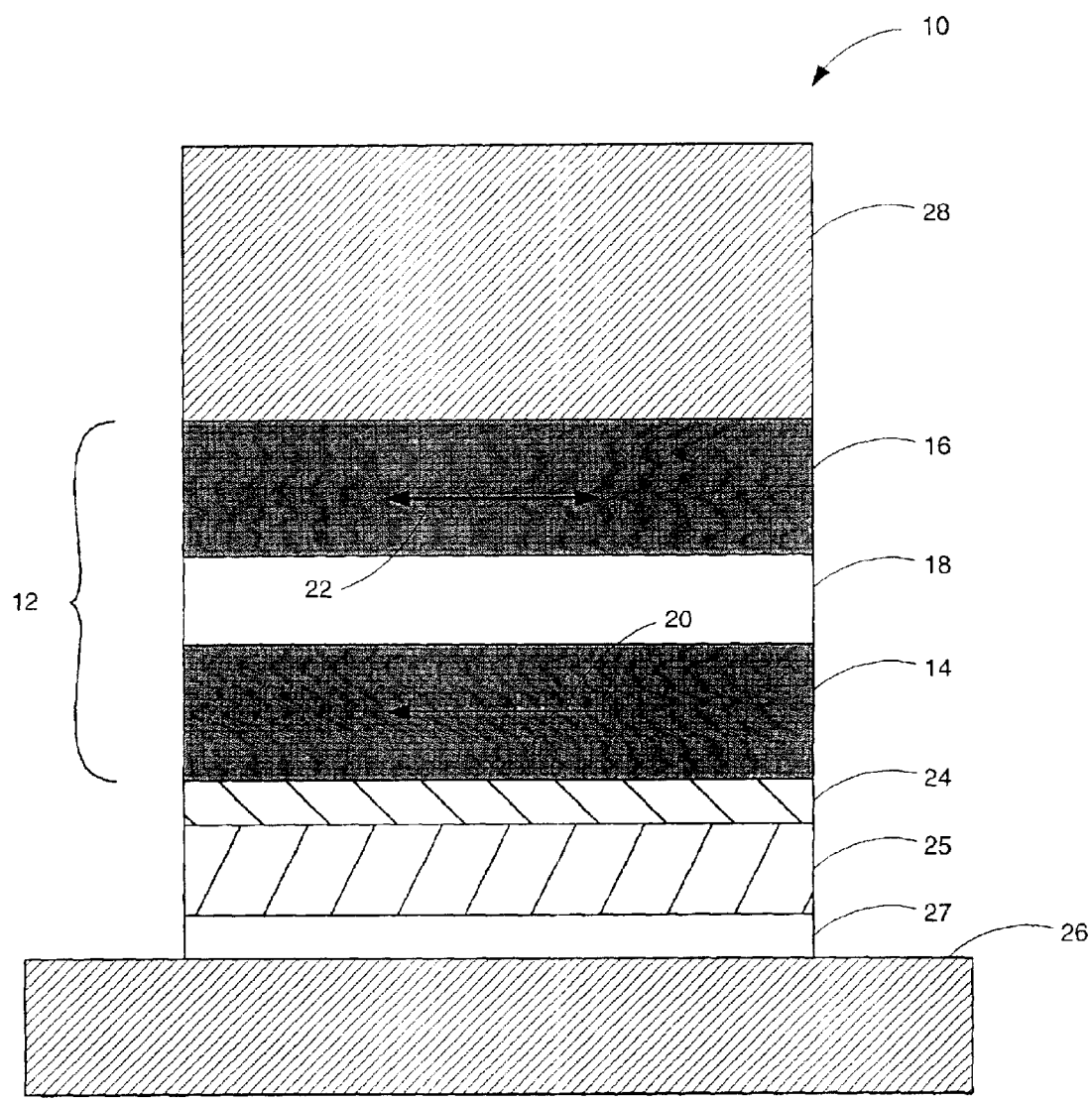
FIG. 1 is a cross-sectional representation of an MRAM cell of the prior art.
Figure 2:
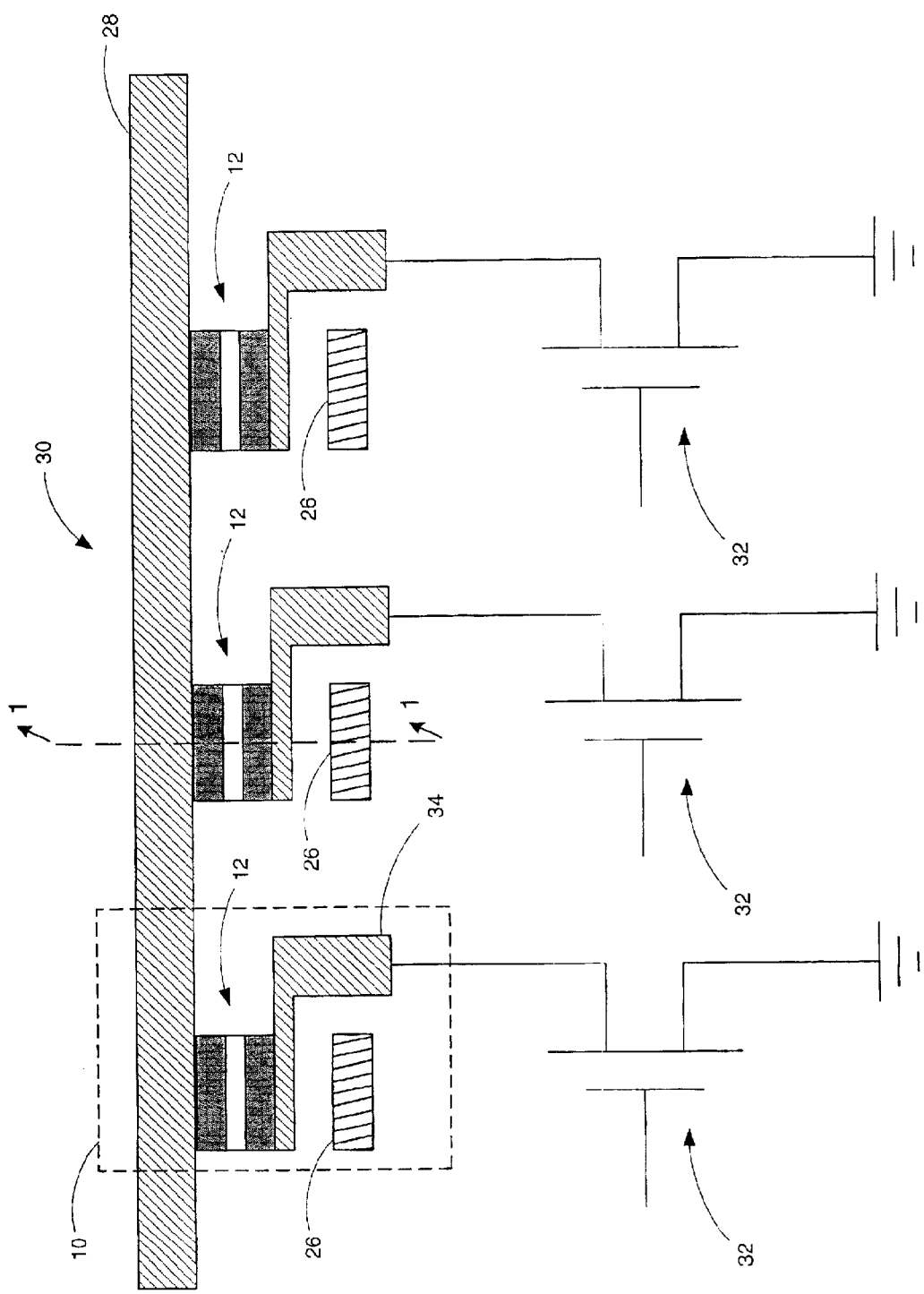
FIG. 2 is a cross-sectional representation of an array of MRAM cells of the prior art.
Figure 3A:
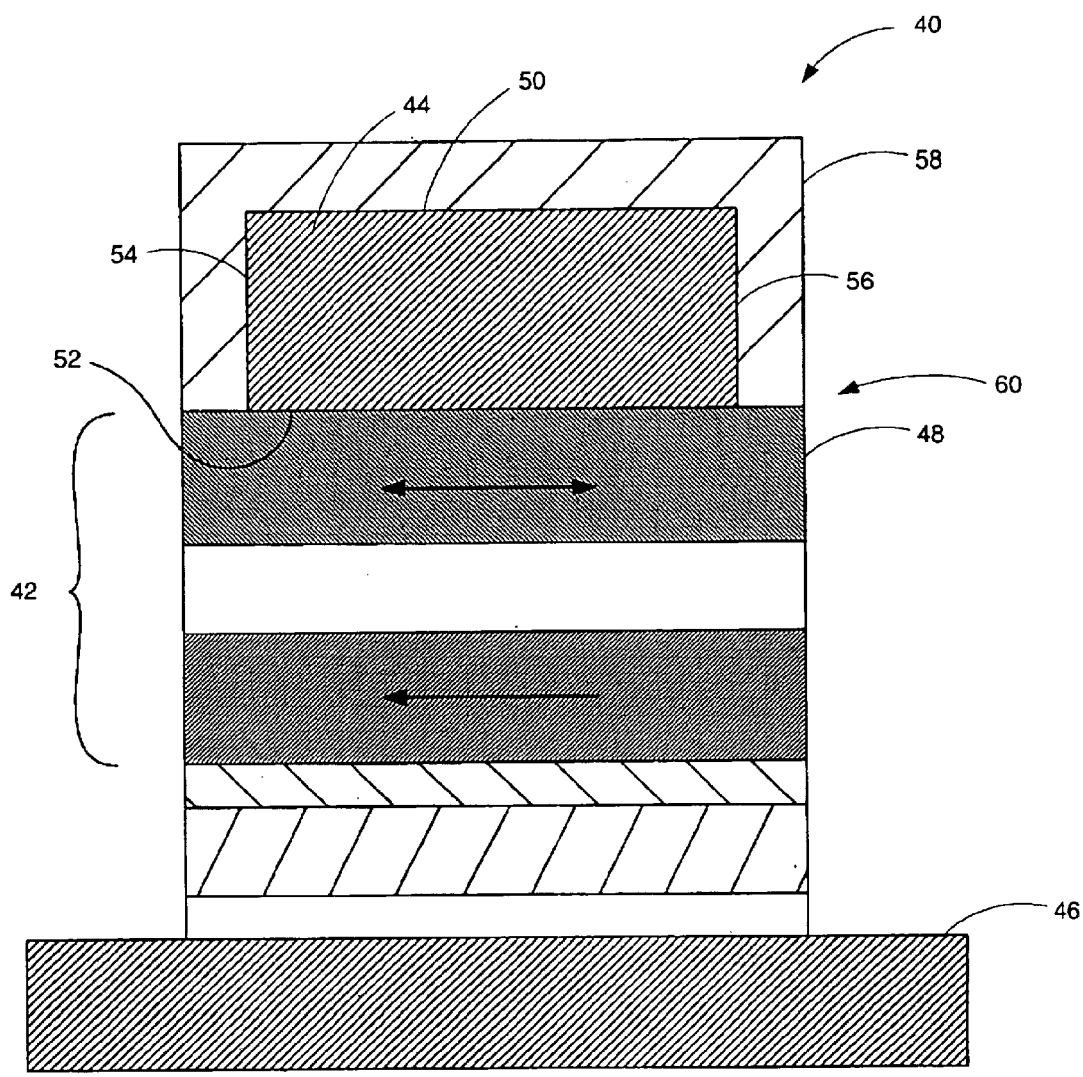
FIGS. 3A and 3B are cross-sectional representations of embodiments of an MRAM cell of the invention.

FIG. 3A is a cross-section of an MRAM cell 40 including a magnetic tunnel junction (MTJ) 42, a bit line segment 44, and a digit line segment 46 arranged essentially as described above with respect to FIG. 1. The bit line segment 44 includes a top surface 50 opposite a bottom surface 52 that is in electrical contact with the free layer 48. The bit line segment 44 also includes first and second vertical surfaces 54 and 56 opposite one another and connecting the top and bottom surfaces 50 and 52.

MRAM cell 40 also includes a magnetic liner layer 58 disposed around the bit line segment 44 and contacting the free layer 48. The magnetic liner layer 58 contacts the first and second vertical surfaces 54 and 56 and the top surface 50 to form, together with the free layer 48, a magnetic sheath 60 disposed around the bit line segment 44. The magnetic sheath 60 permits a magnetic field to encircle the bit line segment 44. The magnetic coupling achieved between the free layer 48 and the magnetic liner layer 58 has the effect of eliminating the deleterious curling of the magnetic domain within the free layer 48, in turn improving the stability of the MTJ 42 at elevated temperatures and under stray magnetic fields.

Figure 3B:
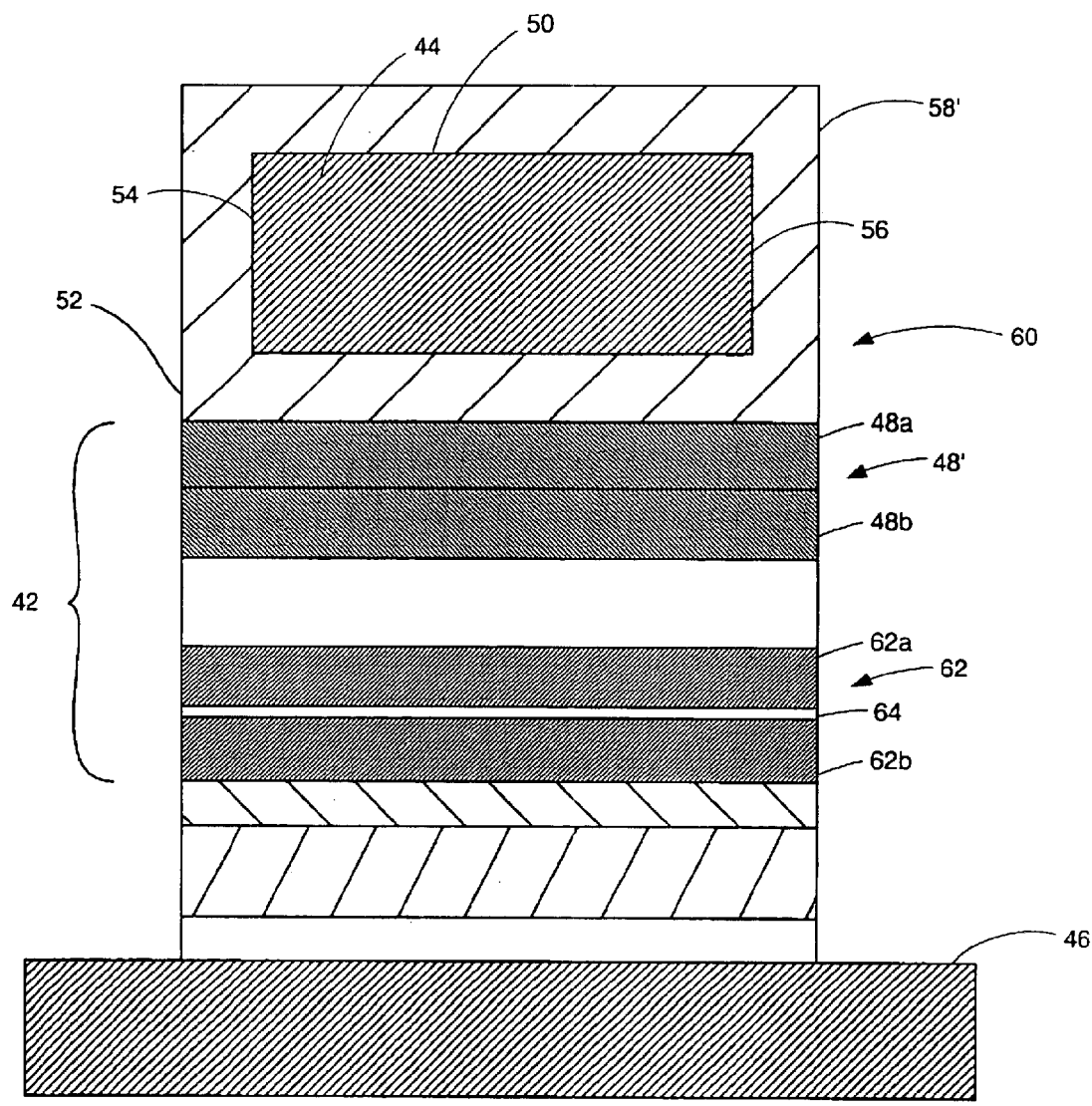
Figure 16:
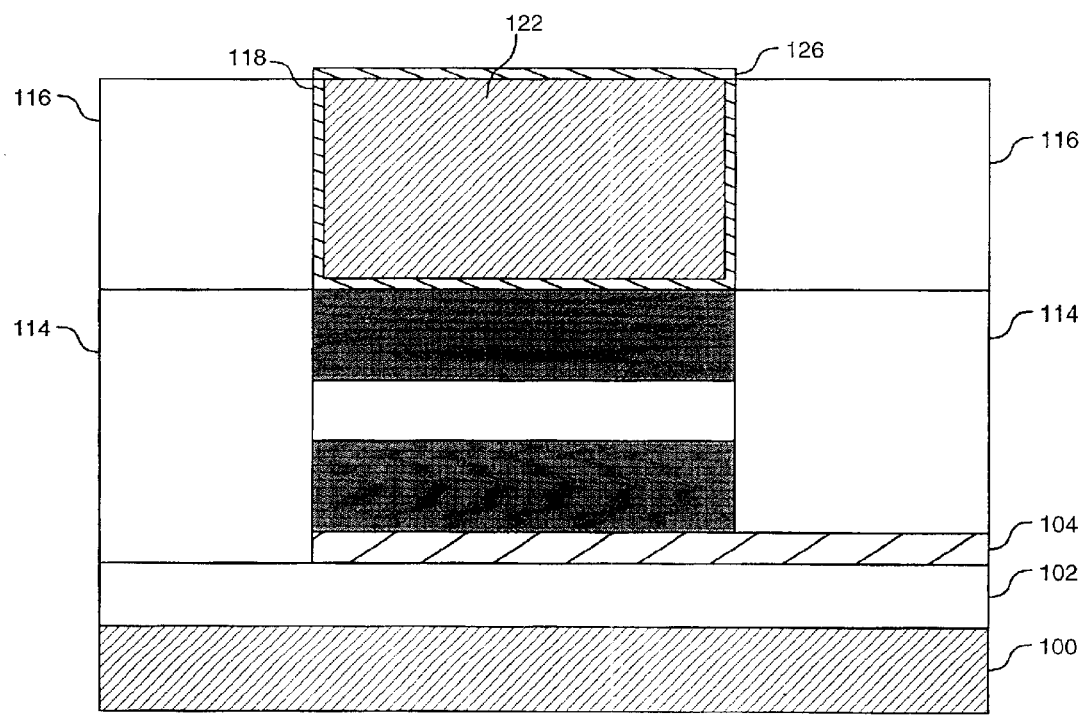

In some embodiments the magnetic liner layer 58 is formed of an electrically conductive material such as Permalloy. In these embodiments the read and write currents are carried by both the bit line segment 44 and the magnetic liner layer 58. The electrically conductive magnetic liner layer 58 allows for the cross-sectional area of the bit line segment 44 to be reduced with the difference made up by the magnetic liner layer 58, as shown in FIG. 3A. Other possible materials for the liner layer 58 include CoZrCr, CoZrNb, CoZrRe, FeSiAl, FeN, FeAlN, FeRhN, and FeTaN. FIG. 3B shows another exemplary embodiment of the invention. In this embodiment the magnetic liner layer 58' forms a sheath entirely around the bit line 44 as is also shown in FIG. 16. Additionally, free layer 48' is formed of two ferromagnetic layers 48a and 48b, and pinned layer 62 is formed of two ferromagnetic layers 62a and 62b separated by a spacer layer 64, both as described below in paragraph [0035] and in Table 1.

Figure 4:
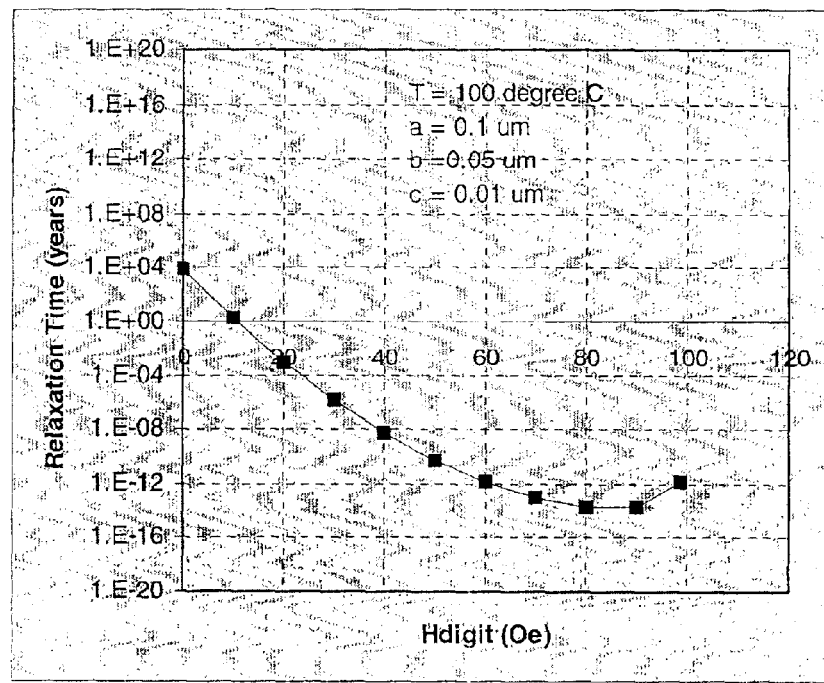
FIG. 4 is a graph of relaxation time plotted against an applied stray magnetic field for an MRAM cell of the prior art.
Figure 5:
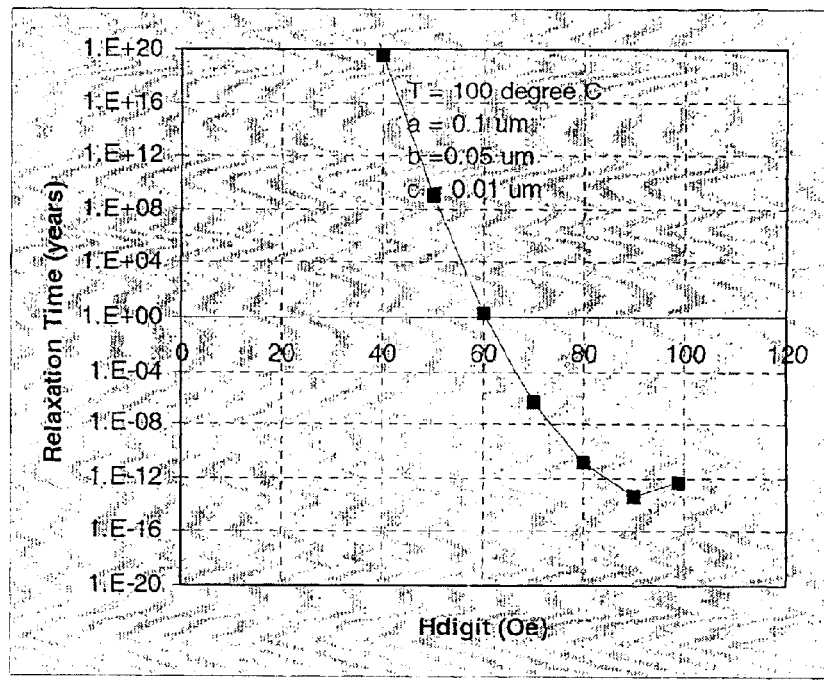
FIG. 5 is a graph of relaxation time plotted against an applied stray magnetic field for an embodiment of an MRAM cell of the invention.
Figure 6:
FIGS. 6–16 are cross-sectional representations of successive stages in the fabrication of an MRAM cell according to an embodiment of the invention.

FIGS. 4 and 5 illustrate the improvement in stability realized in the invention compared to the prior art. FIGS. 4 and 5 are graphs of relaxation time plotted against an applied stray magnetic field for MRAM cells of the prior art and of the invention, respectively. The graphs in both FIGS. 4 and 5 were obtained at 100 degrees centigrade. It can be seen from FIGS. 4 and 5 that for fields below 80 Oe the relaxation time for the invention improves dramatically over that obtained with the prior art. For example, at 20 Oe the relaxation time for an MRAM cell of the prior art is on the order of 0.001 year, whereas for the invention it is in excess of $10^{20}$ years, an improvement of over 23 orders of magnitude.

FIGS. 6–16 are a series of cross-sections showing successive stages in the fabrication of an MRAM cell according to an embodiment of the invention. In FIG. 6a digit line 100 is provided. The digit line 100 should be formed of a highly conductive material. Preferred materials for digit line 100 include metals such as copper, tungsten, and aluminum. The digit line 100 is fabricated on a substrate (not shown) such as a silicon wafer. Any suitable method for providing a digit line 100 will suffice, however, a preferred method includes forming and patterning an oxide layer on the substrate, depositing a conductive metal, and planarizing the top surface with a process such as Chemical Mechanical Polishing (CMP).

Figure 7:
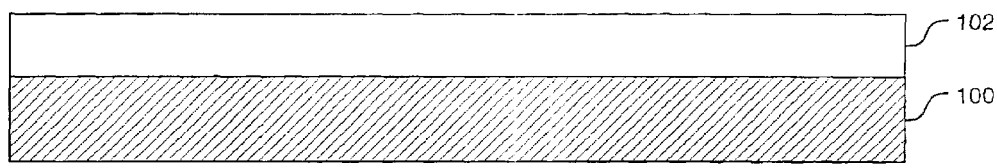

In FIG. 7 an insulating spacer 102 is formed over the digit line 100 out of an electrically insulating material such as aluminum oxide, silicon dioxide, silicon nitride, or silicon oxynitride. A contact via (not shown) is created in the insulating spacer 102 by a technique such as reactive ion etching. The contact via is either in front of or behind the plane of the drawing in FIG. 7 so that it does not intersect the digit line 100. The contact via is etched until a metallization of a CMOS transistor (not shown) is exposed.

Figure 8:
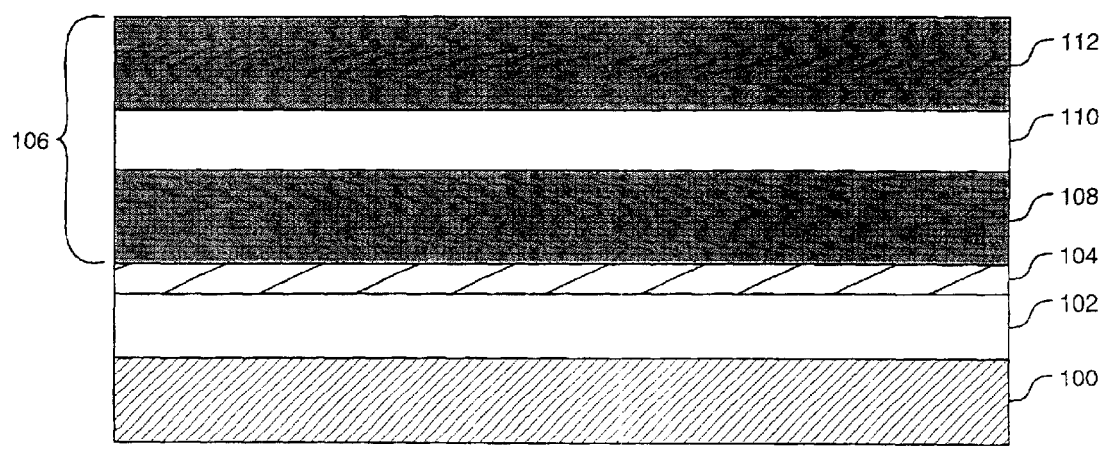

In FIG. 8 a bottom lead 104 is formed over the insulating layer 102 and in some embodiments the contact via is filled by the same process. When the contact via is filled with a conductive material it becomes a conductive path between the bottom lead 104 and the CMOS transistor. The bottom lead 104 should be formed of a highly conductive material. Preferred materials for bottom lead 104 include metals such as copper, tungsten, and aluminum, and can be formed, for example, by thin film deposition or plating.

Next, a MTJ stack 106 is formed over the bottom lead 104. The MTJ stack 106 includes a first ferromagnetic layer 108, a tunneling barrier layer 110, and a second ferromagnetic layer 112. A pinning or antiferromagnetic (AFM) layer (not shown) can be formed between the first ferromagnetic layer 108 and the bottom lead 104, and an AFM seed layer (not shown) may additionally be formed between the antiferromagnetic layer and the bottom lead 104. In these embodiments the first ferromagnetic layer 108 is a pinned layer and the second ferromagnetic layer 112 is a free layer. Alternately, the antiferromagnetic layer can be formed above the second ferromagnetic layer 112 so that the second ferromagnetic layer 112 serves as the pinned layer. The MTJ stack 106 can also include a thin capping layer (not shown) formed of a protective material such as tantalum disposed over the second ferromagnetic layer 112. In the embodiment in which the magnetic layer forms the entire sheath around the bit line segment, the antiferromagnetic layer should be formed between the first ferromagnetic layer 108 and the bottom lead 104.

Table 1 provides preferred compositions and thickness ranges for the various layers of a representative MTJ stack 106. The first ferromagnetic layer 108 in the embodiment shown in Table 1 comprises two ferromagnetic pinned layers separated by a thin spacer layer of ruthenium (Ru). The second ferromagnetic layer 112 in the embodiment shown in Table 1 comprises two ferromagnetic free layers. The capping layer may be either NiFeCr, tantalum, or ruthenium. In addition to PtMn, as listed in Table 1, the antiferromagnetic layer may also be formed of PtPdMn, NiMn, and FeMn. An antiferromagnetic layer formed of about 50 Å to 150 Å of IrMn may also be used.

TABLE I

Layer Compositions and Thickness Ranges for a MTJ Stack 106

| Capping Layer | | NiFeCr, Ta, or Ru | 50Å~200Å |
|---|---|---|---|
| Free Layer 2 | Second | NiFe | 10Å~50Å |
| Free Layer 1 | Ferromagnetic Layer 112 | CoFe | 5Å~30Å |

TABLE I-continued

Layer Compositions and Thickness Ranges for a MTJ Stack 106

| | | | |
|---|---|---|---|
| Capping Layer | | NiFeCr, Ta, or Ru | 50Å~200Å |
| Tunneling Barrier | 110 | AlOx | 5Å~20Å |
| Pinned Layer 2 | First Ferromagnetic | CoFe | 10Å~30Å |
| Spacer | Layer 108 | Ru | 6Å~9Å |
| Pinned Layer 1 | | CoFe | 10Å~30Å |
| AFM Layer | | PtMn | 150Å~350Å |
| AFM Seed Layer | | NiFeCr | 20Å~100Å |

Table 1: Layer Compositions and Thickness Ranges for a MTJ Stack 106

Figure 9:
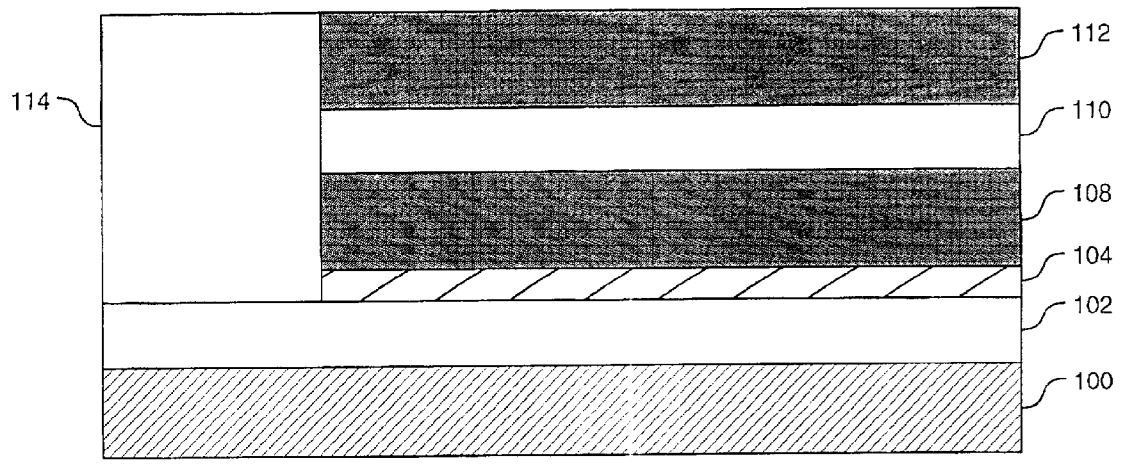
Figure 10:
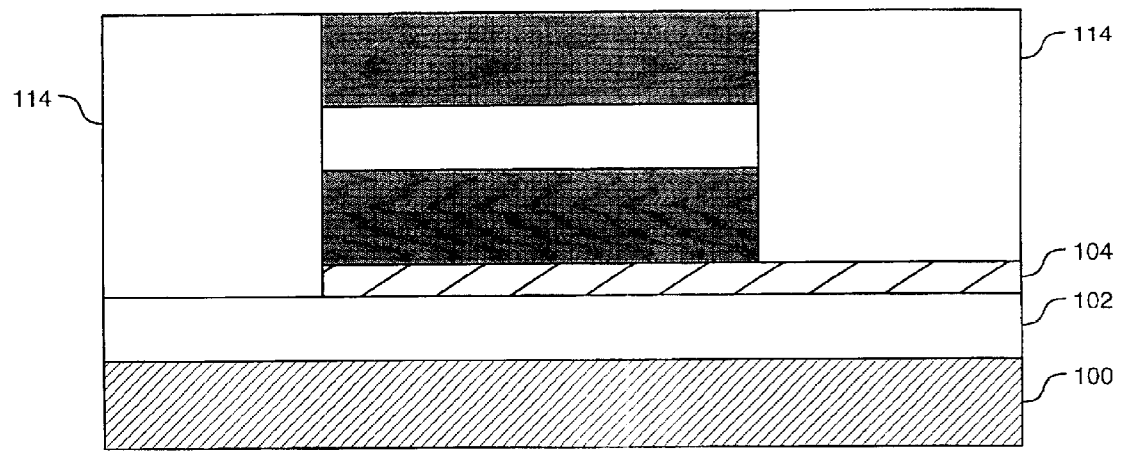

In a first patterning step, shown in FIG. 9, the bottom lead 104 is patterned preferably by forming and patterning a mask and then forming an opening in the MTJ stack 106 and the bottom lead 104 by ion milling until the insulating spacer 102 is exposed. Next, the opening is filled with an insulating material layer 114 such as aluminum oxide, silicon dioxide, or silicon nitride by a suitable deposition technique such as ion beam deposition. In a second patterning step, shown in FIG. 10, an opening in the MTJ stack 106 is formed to expose the bottom lead 104. The second patterning step is otherwise essentially the same as the first patterning step. The opening is filled with an insulating material 114.

Figure 11:
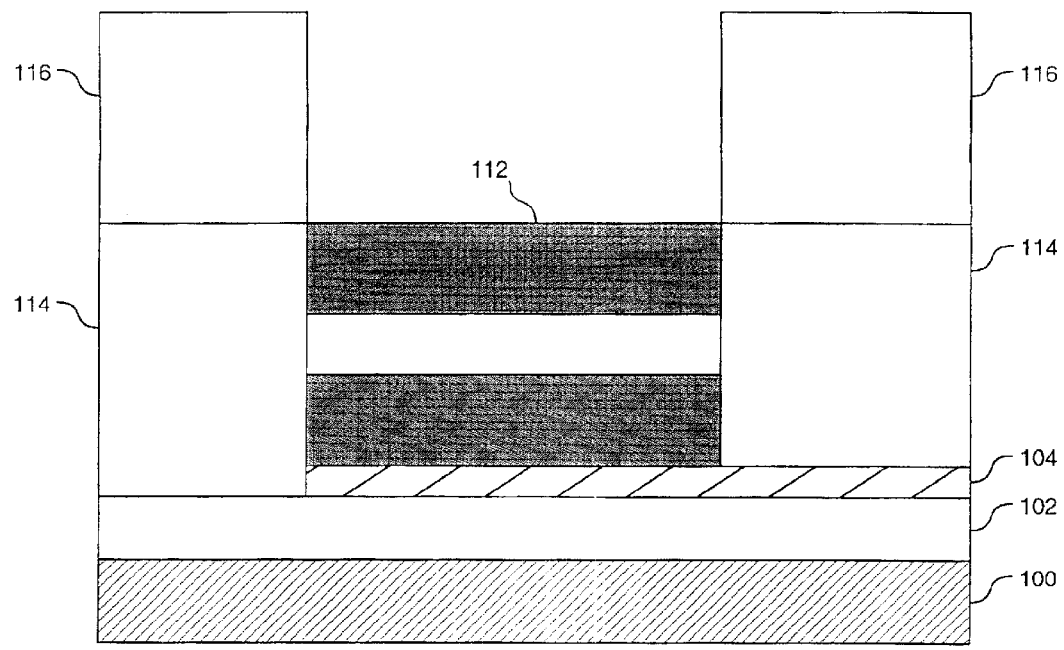

In FIG. 11 a silicon dioxide layer 116 is formed by any suitable deposition technique such as CVD, IBD, RF sputtering. A thin silicon nitride layer (not shown) can be used under the silicon dioxide layer 116 as an etch stop or diffusion barrier. The silicon dioxide layer 116 is patterned to form trenches, for example, by photolithography and reactive ion etching. Each trench exposes the second ferromagnetic layer 112 of successive MRAM cells. The trenches are preferably formed by reactive ion etching (RIE). While silicon dioxide layer 116 is preferably formed of silicon dioxide, one of ordinary skill in the art will recognize that other dielectric materials will also work.

Figure 12:
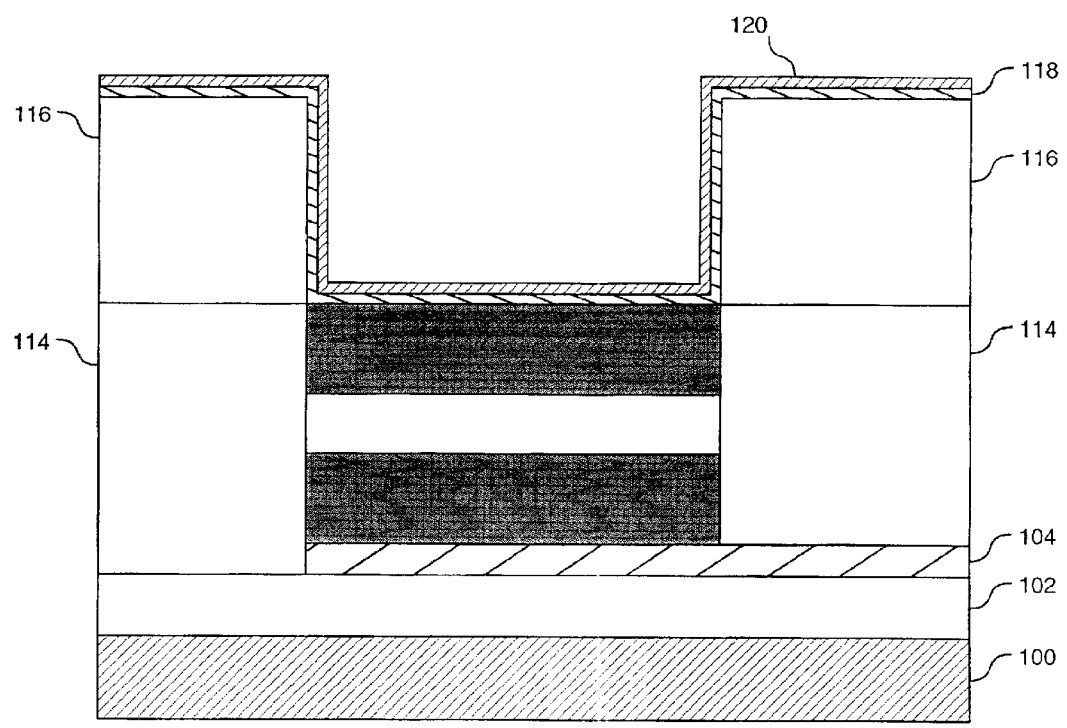

In FIG. 12 a first liner layer 118 is formed over the silicon dioxide layer 116 and the exposed areas of the second ferromagnetic layer 112. First liner layer 118 is preferably formed of Permalloy, a NiFe alloy. A preferred Permalloy composition is $Ni_{81}Fe_{19}$ (atomic %). Other preferred Permalloy compositions include Fe in the range of about 16–22 atomic %. First liner layer 118 can be in the range of about 20 Å–500 Å thick, but is preferably in the range of about 30 Å–100 Å thick. First liner layer 118 can be formed, for example, by ion beam deposition or physical vapor deposition. Optionally, ion milling can be used to remove the portion of the first liner layer 118 on the bottom of the trench while leaving the portions of the first liner layer 118 disposed on the sides of the trench. In this alternative method of formation, the sheath around the bit line will ultimately be formed on three sides by Permalloy while the fourth side will be the free layer of the MTJ.

Next, a stop layer 120 is formed of tantalum or tantalum nitride over the first liner layer 118. Stop layer 120 is typically in the range of about 200 Å–700 Å thick, and is preferably 400 Å thick. Stop layer 120 provides a stop for a subsequent CMP process, discussed below.

Figure 13:
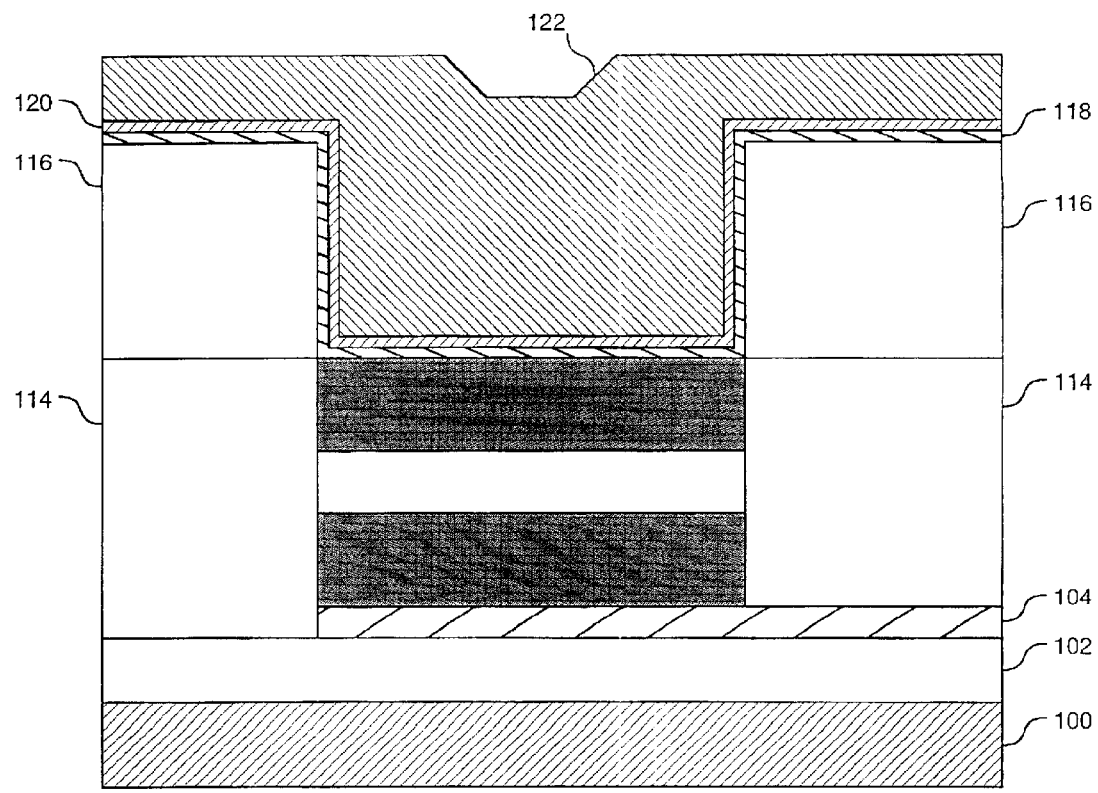
Figure 14:
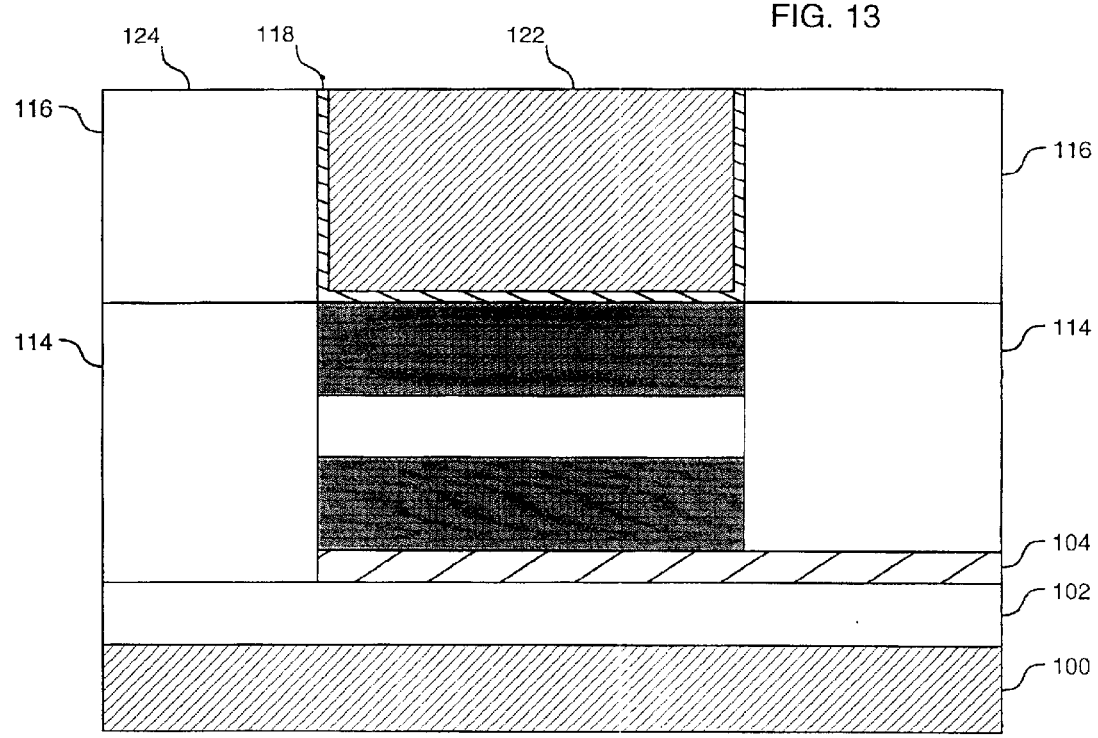

In FIG. 13 a copper layer 122 is formed over the stop layer 120. A copper seed layer (not shown) may additionally be formed on the stop layer 120 prior to the formation of the copper layer 122. The copper layer 122 is preferably formed by plating to a thickness that is sufficient to completely fill the trenches. Care should be taken during plating to avoid voids in the copper layer 122 within the trenches. In FIG. 14 the copper layer 122 is planarized, for example, by CMP to form a planarized surface 124 and to complete the formation of a digit line in each trench. The stop layer 120 can be used as a stop indicator for the CMP process. Additional cleaning of the surface can be performed, for example, with an Ion Beam Etch (IBE).

Figure 15:
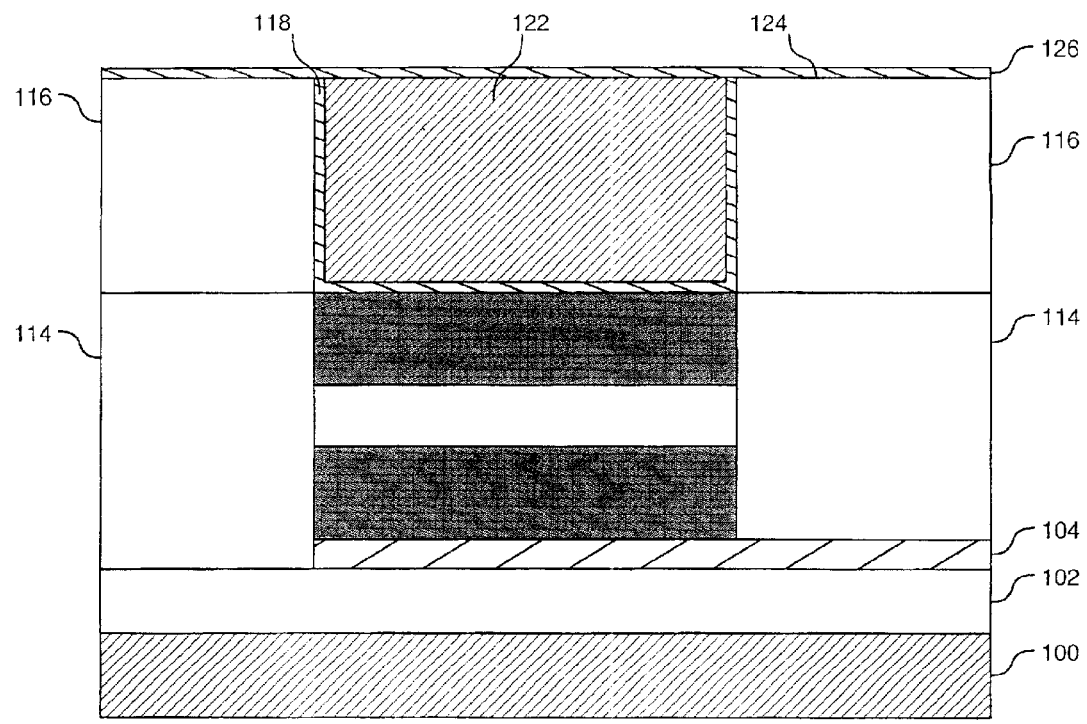

In FIG. 15 a second liner layer 126 is formed over the planarized surface 124 and consequently over the remainder of the copper layer 122. The second liner layer 126 is preferably formed of Permalloy with a composition of $Ni_{81}Fe_{19}$ (atomic %). Other preferred Permalloy compositions include Fe in the range of about 16–22 atomic %. The second liner layer 126 is preferably formed by ion beam deposition or sputtering in a thickness range of about 20 Å to about 500 Å and more preferably in a thickness range of about 30 Å to about 100 Å. In FIG. 16 the second liner layer 126 is patterned by forming and patterning a mask, for example by photolithography, followed by a step of removing portions of the second liner layer 126, for example, by ion milling. The remaining portion of the second liner layer 126 should cover the copper layer 122 to the extent necessary to substantially cover the segment of the copper layer 122 that is directly over the MTJ stack 106. The remaining portion of the second liner layer 126 should additionally cover the ends of the first liner layer 118 to the extent necessary to form a continuous magnetic path between them that will not unduly restrict a magnetic flux.

In the foregoing specification, the invention is described with reference to specific embodiments thereof. It will be recognized by those skilled in the art that while the invention is described above in terms of preferred embodiments, it is not limited thereto. Various features and aspects of the above-described invention may be used individually or jointly. Further, although the invention has been described in the context of its implementation in a particular environment and for particular applications, those skilled in the art will recognize that its usefulness is not limited thereto and that it can be utilized in any number of environments and applications without departing from the broader spirit and scope thereof. The specification and drawings are, accordingly, to be regarded as illustrative rather than restrictive.

What is claimed is:

1. An MRAM cell comprising:
   a magnetic tunneling junction including
   a free layer,
   a pinned layer, and
   a spacer layer disposed between the free layer and the pinned layer;
   a digit line including a digit line segment disposed proximate to the magnetic tunneling junction;
   a bit line including a bit line segment in electrical contact with the magnetic tunneling junction; and
   a magnetic liner layer disposed entirely around the bit line segment and contacting the free layer.

2. The MRAM cell of claim 1 wherein the digit line segment is disposed proximate to the pinned layer and the bit line segment is in electrical contact with the free layer.

3. The MRAM cell of claim 1 wherein the bit line segment is disposed proximate to the pinned layer and the digit line segment is in electrical contact with the free layer.

4. The MRAM cell of claim 1 wherein the magnetic liner layer is electrically conductive.

5. The MRAM cell of claim 1 wherein the bit and digit lines are formed of a metal selected from the group consisting of Cu, W, and Al.

6. The MRAM cell of claim 1 further including an antiferromagnetic layer disposed adjacent to the pinned layer.

7. The MRAM cell of claim 1 wherein the magnetic liner layer is formed of Permalloy.

8. The MRAM cell of claim 7 wherein the Permalloy is between 16 and 22 atomic percent iron.

9. The MRAM cell of claim 7 wherein the Permalloy is $Ni_{81}Fe_{19}$.

10. The MRAM cell of claim 1 wherein the magnetic liner layer has a thickness of about 20 Å to about 500 Å.

11. The MRAM cell of claim 1 wherein the magnetic liner layer has a thickness of about 30 Å to about 100 Å.

12. The MRAM cell of claim 1 wherein the magnetic liner layer is formed of a material selected from the group consisting of CoZrCr, CoZrNb, CoZrRe, FeSiAl, FeN, FeAlN, FeRhN, and FeTaN.

13. The MRAM cell of claim 1 wherein the pinned layer is two ferromagnetic layers separated by a spacer layer.

14. The MRAM cell of claim 1 wherein the free layer is two ferromagnetic layers.

15. An MRAM cell comprising:
a magnetic tunneling junction including
a free layer having a magnetization orientation,
a pinned layer, and
an insulating spacer layer disposed between the free layer and the pinned layer;
a digit line including a segment disposed proximate to the pinned layer;
a bit line including a segment in electrical contact with the free layer;
a magnetic liner layer disposed entirely around the bit line segment and contacting the free layer such that a magnetic field encircles the bit line segment.

16. The MRAM cell of claim 15 wherein the magnetic liner layer is electrically conductive.

17. The MRAM cell of claim 15 wherein the bit and digit lines are formed of a metal selected from the group consisting of Cu, W, and Al.

18. The MRAM cell of claim 15 further including an antiferromagnetic layer disposed adjacent to the pinned layer.

19. The MRAM cell of claim 15 wherein the magnetic liner layer is formed of Permalloy.

20. The MRAM cell of claim 19 wherein the Permalloy is between 16 and 22 atomic percent iron.

21. The MRAM cell of claim 19 wherein the Permalloy is $Ni_{81}Fe_{19}$.

22. The MRAM cell of claim 15 wherein the magnetic liner layer has a thickness of about 20 Å to about 500 Å.

23. The MRAM cell of claim 15 wherein the magnetic liner layer has a thickness of about 30 Å to about 100 Å.

24. The MRAM cell of claim 15 wherein the pinned layer is two ferromagnetic layers separated by a spacer layer.

25. The MRAM cell of claim 15 wherein the free layer is two ferromagnetic layers.

26. An MRAM cell comprising:
a magnetic tunneling junction including
a free layer,
a pinned layer, and
an insulating spacer layer disposed between the free layer and the pinned layer;
a digit line including a segment disposed proximate to the pinned layer, the digit line segment having a long axis defining a first direction;
an electrically insulating spacer layer disposed between the digit line segment and the pinned layer;
a bit line including a segment in electrical contact with the free layer, the bit line segment having a long axis defining a second direction substantially perpendicular to the first direction;
a magnetic liner layer disposed entirely around the bit line segment and contacting the free layer.

27. The MRAM cell of claim 26 wherein the magnetic liner layer is electrically conductive.

28. The MRAM cell of claim 26 wherein the bit and digit lines are formed of a metal selected from the group consisting of Cu, W, and Al.

29. The MRAM cell of claim 26 further including an antiferromagnetic layer disposed adjacent to the pinned layer.

30. The MRAM cell of claim 26 wherein the magnetic liner layer is formed of Permalloy.

31. The MRAM cell of claim 30 wherein the Permalloy is between 16 and 22 atomic percent iron.

32. The MRAM cell of claim 30 wherein the Permalloy is $Ni_{81}Fe_{19}$.

33. The MRAM cell of claim 26 wherein the magnetic liner layer has a thickness of about 20 Å to about 500 Å.

34. The MRAM cell of claim 26 wherein the magnetic liner layer has a thickness of about 30 Å to about 100 Å.

35. The MRAM cell of claim 26 wherein the pinned layer is two ferromagnetic layers separated by a spacer layer.

36. The MRAM cell of claim 26 wherein the free layer is two ferromagnetic layers.

37. An MRAM cell comprising:
a magnetic tunneling junction including
a free layer,
a pinned layer, and
an insulating spacer layer disposed between the free layer and the pinned layer;
a digit line including a segment disposed proximate to the pinned layer, the digit line segment having a long axis defining a first direction;
a bit line including a bit line segment in electrical contact with the free layer and having a long axis defining a second direction substantially perpendicular to the first direction; and
a magnetic sheath disposed entirely around the bit line segment and magnetically coupled to the free layer.

38. The MRAM cell of claim 37 wherein the magnetic liner layer is electrically conductive.

39. The MRAM cell of claim 37 wherein the bit and digit lines are formed of a metal selected from the group consisting of Cu, W, and Al.

40. The MRAM cell of claim 37 further including an antiferromagnetic layer disposed adjacent to the pinned layer.

41. The MRAM cell of claim 37 wherein the magnetic liner layer is formed of Permalloy.

42. The MRAM cell of claim 41 wherein the Permalloy is between 16 and 22 atomic percent iron.

43. The MRAM cell of claim 41 wherein the Permalloy is $Ni_{81}Fe_{19}$.

44. The MRAM cell of claim 37 wherein the magnetic liner layer has a thickness of about 20 Å to about 500 Å.

45. The MRAM cell of claim 37 wherein the magnetic liner layer has a thickness of about 30 Å to about 100 Å.

46. The MRAM cell of claim 37 wherein the pinned layer is two ferromagnetic layers separated by a spacer layer.

47. The MRAM cell of claim 37 wherein the free layer is two ferromagnetic layers.

* * * * *